United States Patent
Pitel et al.

(10) Patent No.: US 9,429,629 B1
(45) Date of Patent: Aug. 30, 2016

(54) ELECTRONIC LOADS

(71) Applicant: Magna-Power Electronics, Inc., Flemington, NJ (US)

(72) Inventors: Ira J. Pitel, Flemington, NJ (US); Grant E. Pitel, Flemington, NJ (US); Adam J. Pitel, Flemington, NJ (US)

(73) Assignee: Magna-Power Electronics, Inc., Flemington, NJ (US)

( * ) Notice: Subject to any disclaimer, the term of this patent is extended or adjusted under 35 U.S.C. 154(b) by 183 days.

(21) Appl. No.: 14/198,837

(22) Filed: Mar. 6, 2014

Related U.S. Application Data

(60) Provisional application No. 61/775,847, filed on Mar. 11, 2013.

(51) Int. Cl.
| | |
|---|---|
| H02J 1/00 | (2006.01) |
| G01R 31/40 | (2014.01) |
| G01R 1/20 | (2006.01) |
| H02J 3/14 | (2006.01) |

(52) U.S. Cl.
CPC ............... *G01R 31/40* (2013.01); *G01R 1/203* (2013.01); *H02J 3/14* (2013.01)

(58) Field of Classification Search
CPC ......... H02J 1/14; H02J 3/14; H02M 3/33561
USPC ............. 307/31; 323/311–317; 327/538–543
See application file for complete search history.

(56) References Cited

U.S. PATENT DOCUMENTS

| | | | |
|---|---|---|---|
| 6,504,395 B1 | 1/2003 | Johnson | 324/765 |
| 7,215,183 B2* | 5/2007 | Nakada | G05F 3/30 327/143 |
| 7,466,162 B2 | 12/2008 | Wong et al. | 324/771 |
| 7,636,010 B2* | 12/2009 | Huang | 327/539 |
| 7,643,263 B2 | 1/2010 | Abudul Muthalib et al. | 361/93.1 |
| 8,242,629 B2 | 8/2012 | Palatini et al. | 307/31 |
| 8,884,642 B2* | 11/2014 | Chang | G01R 35/007 323/313 |
| 8,933,682 B2* | 1/2015 | Shiina | 323/313 |
| 2005/0134248 A1 | 6/2005 | Locker et al. | 323/285 |
| 2008/0111575 A1* | 5/2008 | Ogiwara | G01R 31/3004 324/750.3 |
| 2010/0289562 A1* | 11/2010 | Kohama | H03K 17/0828 327/541 |
| 2011/0090604 A1* | 4/2011 | Butler | H03F 1/52 361/18 |
| 2011/0163798 A1* | 7/2011 | Maejima | G11C 5/145 327/538 |
| 2012/0242365 A1* | 9/2012 | Singh | G01R 31/42 324/762.01 |

OTHER PUBLICATIONS

"Insulated-gate bipolar transistor," or IGBT, Wikipedia, Mar. 2, 2013.
"MOSFET" the metal-oxide-semiconductor field-effect transistor, Wikipedia, Mar. 2, 2013.

* cited by examiner

*Primary Examiner* — Jared Fureman
*Assistant Examiner* — Alfonso Perez Borroto
(74) *Attorney, Agent, or Firm* — MacCord Mason PLLC

(57) ABSTRACT

An apparatus for providing a test load includes a current source in series with a resistor circuit. The current source may be a MOSFET, a shunt resistor, and operational amplifier. The resistor circuit includes a plurality of resistors and a plurality of switching semiconductors. The resistors and Insulated Gate Bipolar Transistors are arranged so that the Insulated Gate Bipolar Transistors can be switched on or off to place the resistors in series, parallel, or both with one another, thereby affecting the resistance of the resistor circuit. A microprocessor or digital signal processor outputs signals to switch the Insulated Gate Bipolar Transistors on or off.

20 Claims, 6 Drawing Sheets

Simplified System with Filter

| Q1,2 | ON | ON | OFF |
|---|---|---|---|
| RT | R/2 | R | 2R |
| Q1/2 DUTY | 100% | 50% | 100% |

NOTE:

R=R1=R2

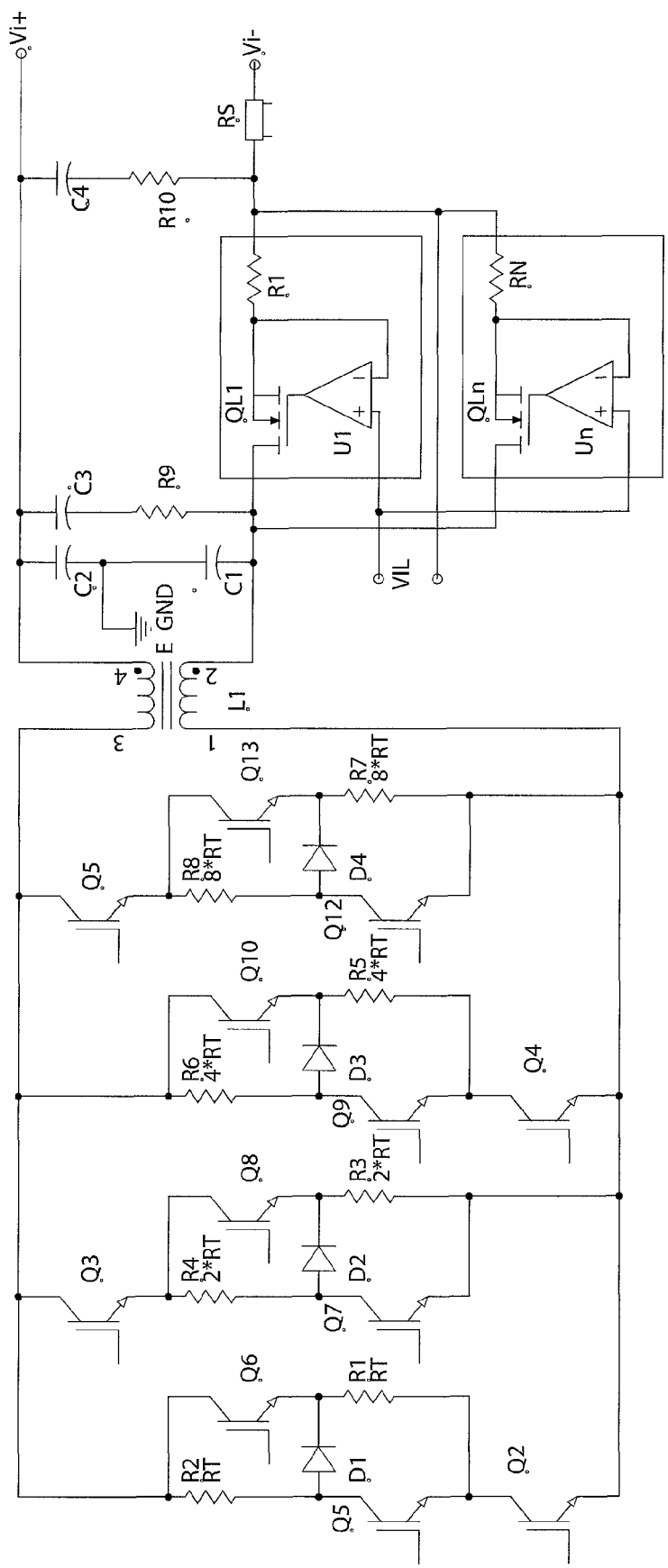
Figure 6 Simplified System with Filter

ELECTRONIC LOADS

This application claims the benefit of Provisional Application Ser. No. 61/775,847 filed Mar. 11, 2013.

BACKGROUND OF THE INVENTION

Electronic loads are usually comprised of banks of MOSFET's tied in parallel and are operated in the active region. They dump power into the active devices and are used in testing power supplies. One way to drive down the cost is to parallel resistive loads with conventional MOSFET loads to enable the resistors to share power loss. Resistors are cheaper than MOSFET's and can be operated at higher temperatures. For example, it is known from U.S. Pat. No. 8,242,629 to Palatini, et al. to add passive resistors in parallel to the MOSFETS. However, it is believed that the response would be slow when switching the resistors, and power cannot be distributed equally among the resistors.

What is needed is a switching matrix of resistors that would share losses between resistors and the resistors would be in series with the active load to enable a quick response and low ripple when switching. Putting resistors in series with the collector of bipolar devices or in series with the drain of MOSFET devices is a common method for removing heat from the power device.

SUMMARY OF THE INVENTION

The present invention fulfills one or more of these needs in the art by providing an apparatus for providing a test load including a current source in series with a resistor circuit. The resistor circuit includes a plurality of resistors and a plurality of switching semiconductors arranged so that the switching semiconductors can be switched on or off to place the resistors in series or parallel with one another, thereby affecting the resistance of the resistor circuit.

In a preferred embodiment the switching semiconductors are Insulated Gate Bipolar Transistors. The current source may be a MOSFET, a shunt resistor, and operational amplifier.

A microprocessor or digital signal processor can be used to output signals to switch the switching semiconductors on or off.

In one embodiment, resistor banks are operated in series, parallel, or both, but the combination is connected in series with the current source. In an embodiment, resistors in the resistor circuit are in parallel with one another and include resistors that have resistances that double from one resistor another so that a desired resistance of the resistor circuit is obtained.

The invention can also be considered as a method of providing a variable electrical load including providing some load in a current source MOSFET, and providing additional load in series with the MOSFET including electronically switching a plurality of resistors into and out of series and parallel relation with one another to cause load variations. Electronically switching includes turning switching semiconductors on and off to place the resistors in series or parallel with one another. Transients arising from electronically switching can be compensated by the current source or can be damped by a passive inductive capacitive filter.

BRIEF DESCRIPTION OF THE DRAWINGS

The invention will be better understood by a reading of the Detailed Description of the Examples of the Invention along with a review of the drawings, in which:

FIG. 6 is a schematic of the components including a passive inductive capacitive filter added to the switching resistive network to compensate for transient conditions of the changing resistor combinations.

DETAILED DESCRIPTION OF EXAMPLES OF THE INVENTION

Figure 1:
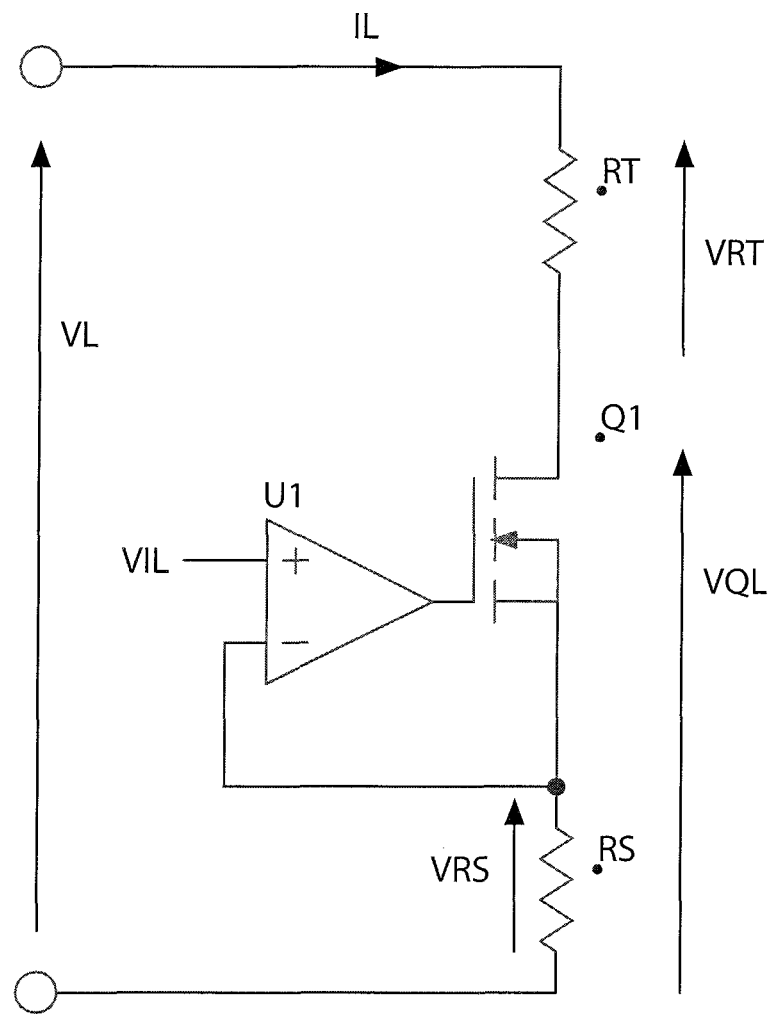
FIG. 1 is a schematic of the basic components.

A preferred embodiment of an electronic load includes two series elements: a resistor RT and current source, QL. As shown in FIG. 1, the current source consists of MOSFET Q1, shunt resistor RS, and operational amplifier U1. The load current, IL, is set with voltage VIL applied to the positive input to operational amplifier U1. VIL drives the gate of Q1 high until the voltage across the shunt resistors, VRS, equals that of VIL. The load current, IL, will be equal to VRS/RS.

Assuming the power across the shunt resistor is insignificant, the power dissipated in load resistor RT is IL×VRT and the power dissipated in the MOSFET Q1 is IL×VQL. The cost for dissipating power in resistors is about an order of magnitude less than dissipating power in semiconductors. Furthermore, resistors can be operated at a higher temperature, making cooling costs less than that of semiconductors. Keeping VQL small and VRT large lowers the system cost in comparison with purely semiconductor electronic loads. Adjusting the value of resistor RT can be accomplished in many ways.

Figure 2:
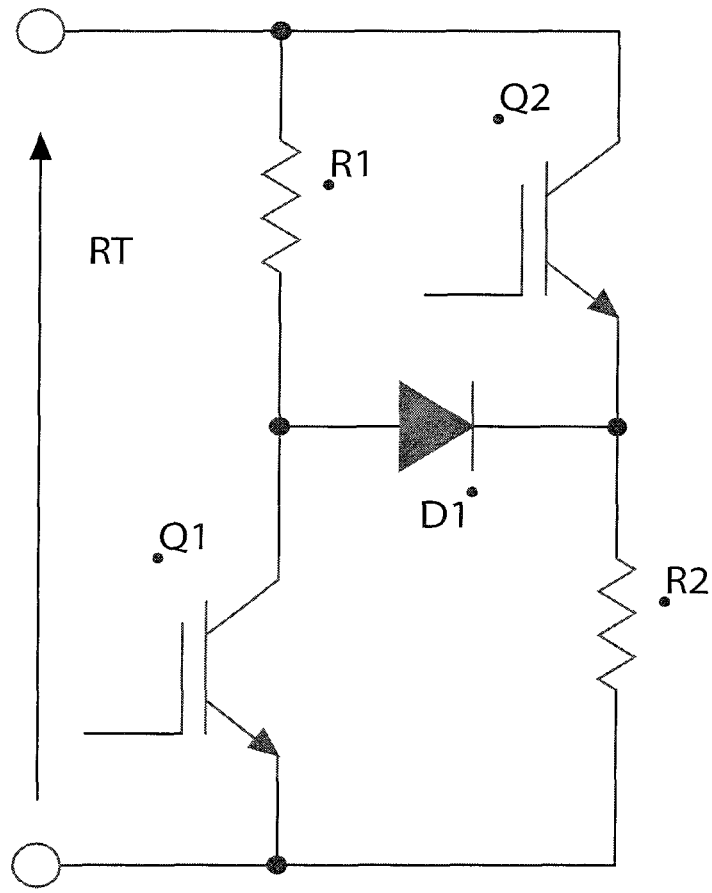
FIG. 2 is a schematic of a two resistor load.
Figure 3:
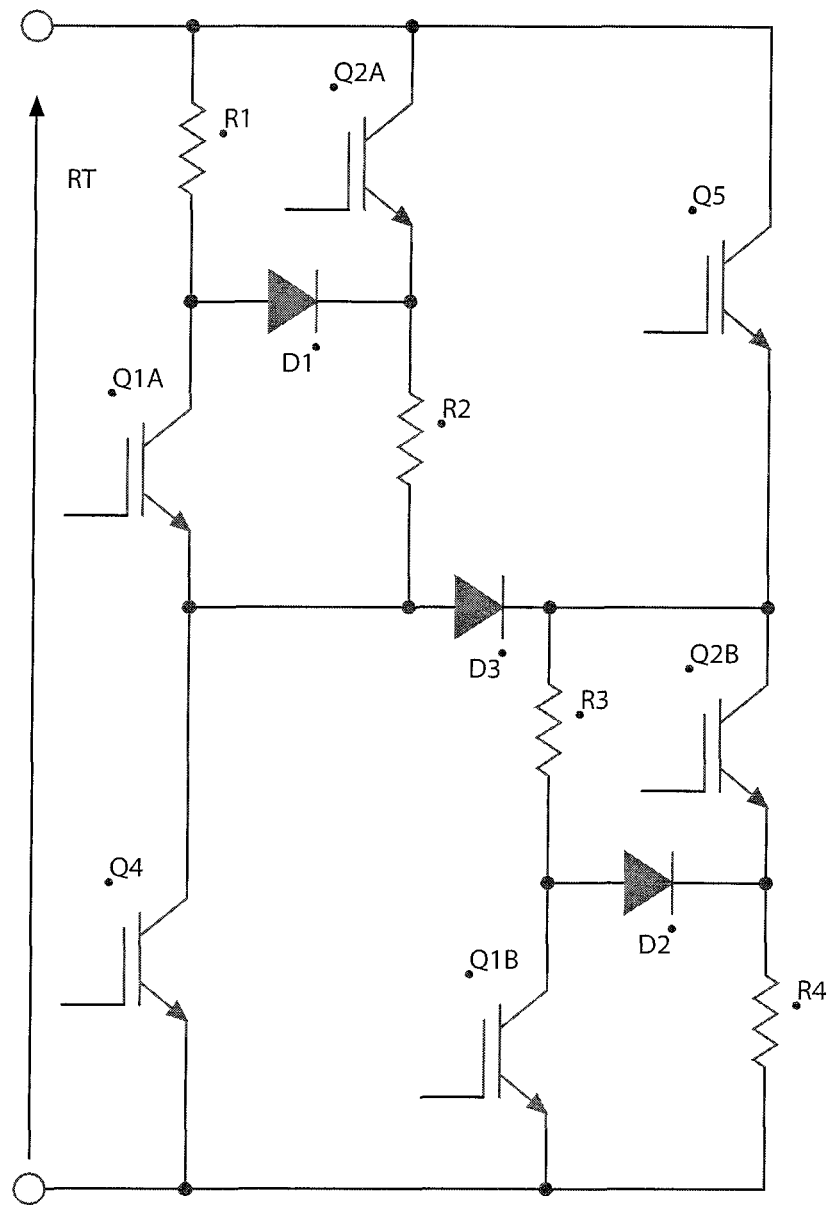
FIG. 3 is a schematic of a four resistor load bank.

FIG. 2 shows a circuit to provide the resistance RT used in FIG. 1. This circuit places two resistors R1 and R2 in series or in parallel, depending on the on/off states of Insulated Gate Bipolar Transistors (IGBT) Q1 and Q2. With the two electronic switches on, R1 and R2 are placed in parallel. With the two electronic switches off, R1 and R2 are placed in series. If the values of R1 and R2 are equal and set to R, the change in resistance is either R/2 or 2R—a four to one change. A third state can be accomplished if IGBT Q1 and Q2 are pulse width modulated with a 50% duty cycle. In this case the resistance is R. With proper voltage applied, the resistors can be operated at its full power rating. FIG. 3 illustrates how four resistors can be configured and their respective series parallel circuit arrangement affected by switches such as IGBT's.

A transient voltage will be produced during IGBT switching transitions. MOSFET Q1 operates as a current source, so configuring it in series with the changing resistor elements allows the current source to compensate for transients arising from changing resistor combinations. As seen in FIG. 6, a passive inductive capacitive filter can be added to the switching resistive network to ensure that the response of MOSFET Q1 can easily compensate for any transient conditions of the changing resistor combinations.

Figure 4:
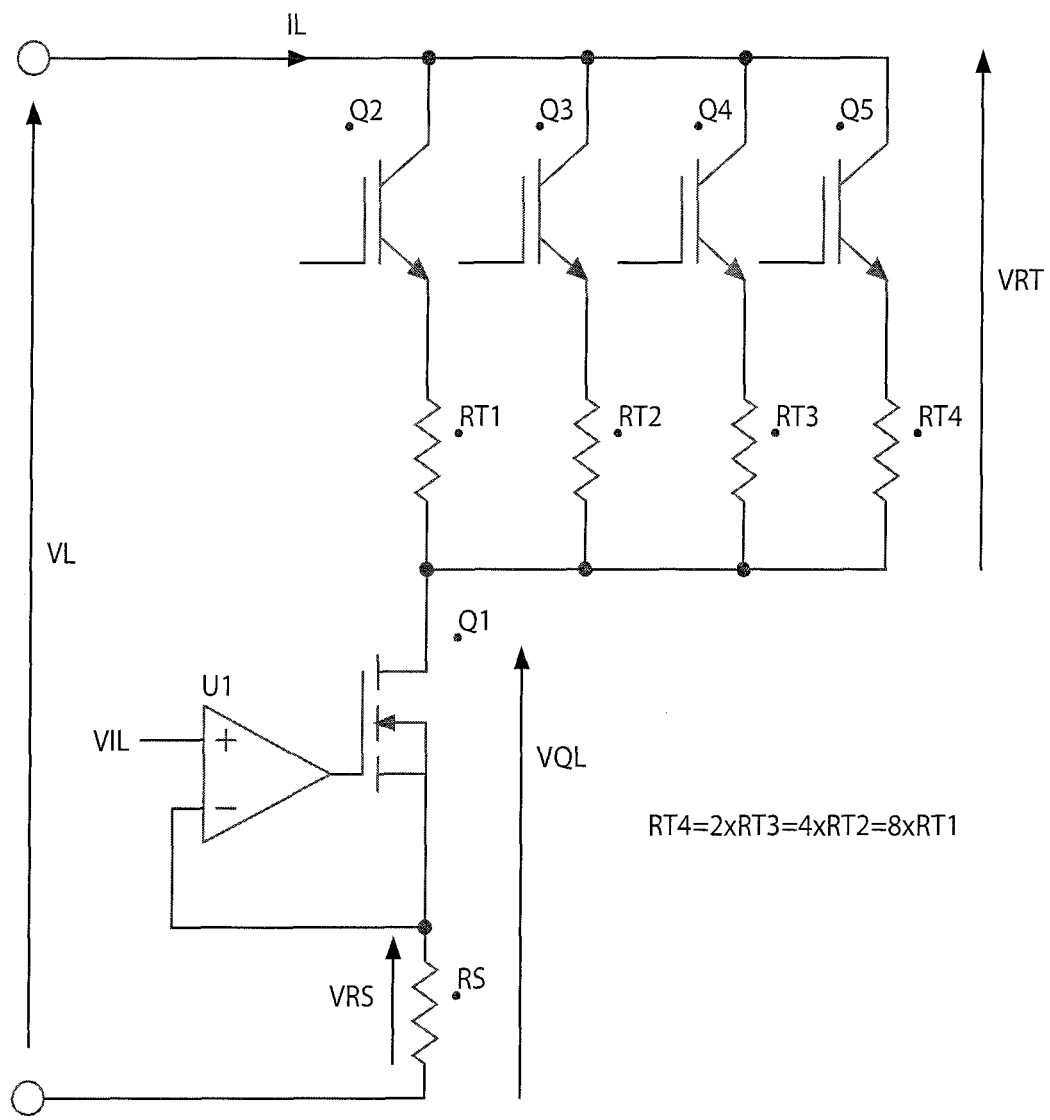
FIG. 4 is a schematic of the basic components with switched binary resistors.

The number of switching resistive components has a great influence on the performance of the system. The resistor banks do not have to be equal. A currently preferred embodiment shown in FIG. 4 has banks of resistors in binary format connected in parallel; that is, R, 2R, 4R, 8R, etc. They can also be connected in series. The binary format of the resistors in the resistor circuit means the resistances of the resistors double from one resistor to another so that a desired resistance of the resistor circuit is obtained. This enables the finest change in resistance per step for the number of resistive components used. Using this arrangement along with the circuitry illustrated in FIG. 1 or 2 provides a wide range of resistive values with small step changes.

Figure 5:
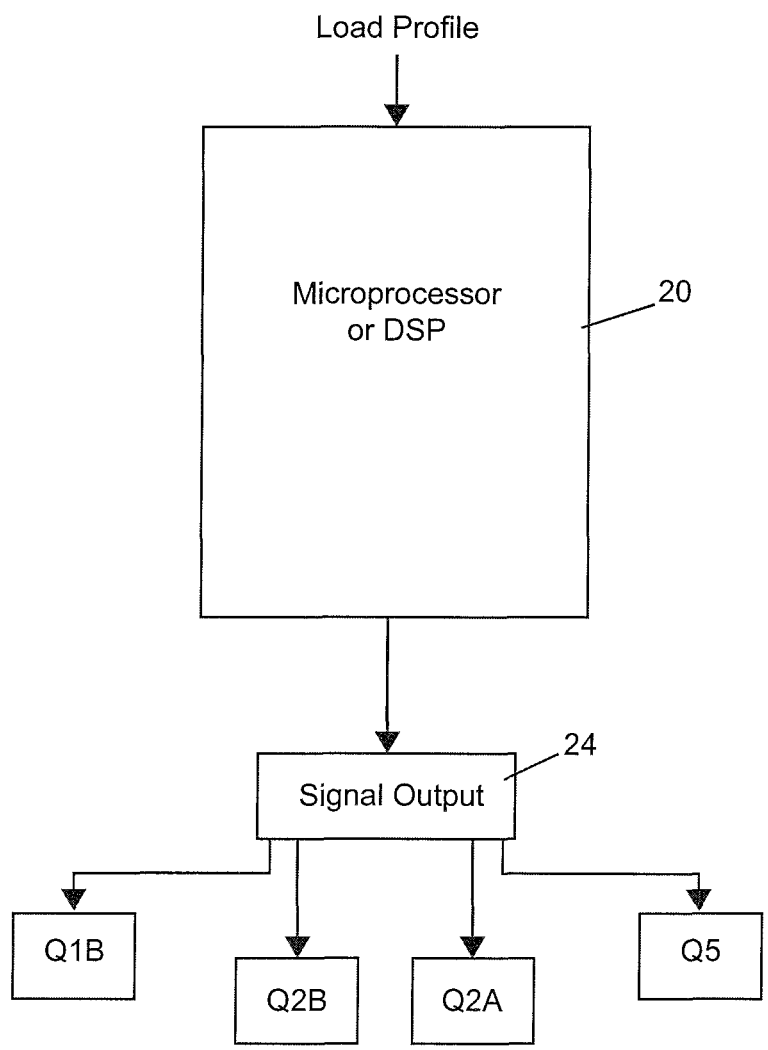
FIG. 5 is a block diagram of a control input for the switched resistors.

The source of the decision-making that is used to turn on or off the IGBT's can be implemented by using a microprocessor or digital signal processor (DSP). Other signal sources could also be used. An exemplary circuit for use with the load circuit of FIG. 3 is seen in FIG. 5. A desired load profile is loaded into a microprocessor or DSP 20, which determines which of the IGBT's are to be on or off to obtain the desired amount of load to put into series with the MOSFET. A serial stream of data from the microprocessor is converted in a signal output module 24 to a parallel stream, for each of the IGBT's in a logic level high or low that can be applied to the gate of the IGBT. Other modes of converting the load profile to gate inputs can be used.

Since the IGBT's are operated in on/off switching states, power loss for these parts is minimal. Power loss and cooling requirements greatly affect the cost of the system. The number of IGBT's, which are used as electronics switches, is only a minor cost in relation to the rest of the system.

While one can devise a less complicated resistive switching system by simply paralleling resistors, it is the series and parallel combination that allows a wide range of resistive values along with each element being able to dissipate power equally. Combining this feature along with a series current source allows a significant cost advantage over purely semiconductor loads. The resistance switching section could be used without the series current source.

In this design, the bulk of the load will be provided by the combinations of the resistances that make up RT. Each of the resistors that are either in parallel or series or combinations of those to make up RT are always a part of RT, and are not switched out of the system. As a result, the resistors in RT always will be carrying some current and contributing to the overall load. The resistors' positions in the series/parallel arrangement provide the desired overall resistive load.

Certain modifications and improvements will occur to those skilled in the art upon reading the foregoing description. It should be understood that all such modifications and improvements have been omitted for the sake of conciseness and readability, but are properly within the scope of the following claims.

What is claimed is:

1. An apparatus for providing a test load comprising:
a current source in series with a resistor circuit, the resistor circuit including a plurality of resistors including at least a first resistor and a second resistor and a plurality of switching semiconductors, the resistors and switching semiconductors arranged so that the switching semiconductors can be switched on or off to place the first and second resistors in series with one another or in parallel with one another at times that are not simultaneous or the switching semiconductors can be modulated on and off at a 50% duty cycle,
thereby affecting the resistance of the resistor circuit.

2. The apparatus as described in claim 1 wherein the switching semiconductors are Insulated Gate Bipolar Transistors, MOSFET's, or bipolar devices.

3. The apparatus as described in claim 1 wherein the current source comprises a MOSFET or other semiconductor device, a shunt resistor, and operational amplifier.

4. The apparatus as described in claim 1 further comprising a microprocessor or digital signal processor outputting signals to switch the switching semiconductors on or off.

5. The apparatus as described in claim 1 wherein the first resistor and the second resistor of the resistor circuit each contains multiple resistor banks so that the switching semiconductors can be switched on or off to place the resistor bank of the first resistor and the resistor bank of the second resistor in series with one another, in parallel with one another, or modulated on and off, but in series with the current source.

6. The apparatus as described in claim 5 wherein the resistor circuit includes additional resistor banks that have resistances that double from one resistor bank to another so that a desired resistance of the resistor circuit is obtained.

7. The apparatus as described in claim 1 wherein one resistor of the resistor circuit has a resistance twice another.

8. An apparatus for providing a test load comprising:
a current source in series with a resistor circuit, the current source comprising a MOSFET or other semiconductor device, a shunt resistor, and operational amplifier, the resistor circuit including a plurality of resistors banks including a first resistor and a second resistor and a plurality of switching semiconductors, the resistors and switching semiconductors arranged so that at times that are not simultaneous the switching semiconductors can be switched on or off to place the first and second resistors in series with one another or parallel with one another or the switching semiconductor can be modulated on and off, thereby affecting the resistance of the resistor circuit, and
a microprocessor or digital signal processor outputting signals to switch the switching semiconductors on or off.

9. The apparatus as described in claim 8 wherein resistors in the resistor bank are in parallel with one another and include resistors that have resistances that double from one resistor another so that a desired resistance of the resistor circuit is obtained.

10. A method of providing a variable electrical load comprising
connecting to a voltage to be exposed to the variable electrical load,
providing a first amount of load in a current source MOSFET, and
providing additional load in series with the MOSFET including electronically switching a plurality of resistors into and out of series and parallel relation with one another to cause load variations so that at least two resistors are sometimes in parallel with one another and the same two resistors are sometimes in series with one another but not simultaneously in parallel and series with one another.

11. The method as described in claim 10 wherein electronically switching includes turning switching semiconductors on and off to place the resistors in series or parallel with one another and modulating the switching semiconductors on and off at a 50% duty cycle.

12. The method as described in claim 10 wherein voltage changes arising from electronically switching are compensated by the current source.

13. The method as described in claim 10 wherein transients arising from electronically switching are damped by a passive inductive capacitive filter.

14. The apparatus as described in claim 8 wherein the switching semiconductors are Insulated Gate Bipolar Transistors.

15. The apparatus as described in claim 1 wherein the resistor circuit includes a third resistor arranged so that switching semiconductors can be switched on or off to
place the first and second resistors in series or parallel with one another and in series with the third resistor, or to
place the first and second resistors in series or parallel with one another and in parallel with the third resistor, thereby affecting the resistance of the resistor circuit.

16. The apparatus as described in claim 8 wherein the resistor circuit includes a third resistor arranged so that switching semiconductors can be switched on or off to
place the first and second resistors in series or parallel with one another and in series with the third resistor, or to
place the first and second resistors in series or parallel with one another and in parallel with the third resistor, thereby affecting the resistance of the resistor circuit.

17. The apparatus as described in claim 1 wherein the first and second resistors are comprised of banks of resistors where each bank of resistors can be switched in series, parallel, or modulated on and off.

18. The apparatus described in claim 1 wherein for first and second resistors that are each of resistance R, the apparatus can produce an equivalent resistance value of R/2 if the first and second resistors are switched in parallel and an equivalent value of 2R if the first and second resistors are switched in series.

19. The apparatus described in claim 1 wherein for first and second resistors of resistance R, the apparatus can produce an equivalent resistance value of R if the switching semiconductors modulate both the first and second resistors on and off with a 50% duty cycle.

20. The apparatus described in claim 1 wherein
the apparatus dissipates the same amount of power in each of the first and second resistors when the first and second resistors are switched in series with one another, and
the apparatus dissipates the same amount of power in each of the first and second resistors when first and second resistors are switched in parallel with one another, and
the apparatus dissipates the same amount of power in each of the first and second resistors when the switching semiconductors are modulated on and off with a 50% duty cycle.

* * * * *